(12) United States Patent
Walton

(10) Patent No.: US 6,483,468 B2
(45) Date of Patent: *Nov. 19, 2002

(54) ON-GLASS IMPEDANCE MATCHING ANTENNA CONNECTOR

(75) Inventor: Eric K. Walton, Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/941,172

(22) Filed: Aug. 28, 2001

(65) Prior Publication Data

US 2002/0027532 A1 Mar. 7, 2002

Related U.S. Application Data

(63) Continuation of application No. 09/349,067, filed on Jul. 8, 1999, now Pat. No. 6,320,558.

(51) Int. Cl.[7] .................................................. H01Q 1/32
(52) U.S. Cl. ........................................ 343/713; 349/906
(58) Field of Search ................................ 343/713, 711, 343/712, 850, 860, 864, 906; H01Q 1/32

(56) References Cited

U.S. PATENT DOCUMENTS

| | | |
|---|---|---|
| 4,475,108 A | 10/1984 | Moser ......................... 343/700 |
| 4,764,773 A | 8/1988 | Larsen et al. ................. 343/713 |
| 5,014,346 A | 5/1991 | Phillips et al. ................. 455/89 |
| 5,138,330 A | 8/1992 | Lindenmeier et al. ....... 343/713 |
| 5,293,177 A | 3/1994 | Sakurai et al. .............. 343/906 |
| 5,577,269 A | 11/1996 | Ludewig ....................... 455/90 |
| 5,739,790 A | 4/1998 | Green, Jr. .................... 343/702 |
| 5,812,098 A | 9/1998 | Harris et al. ................. 343/906 |
| 5,821,904 A * | 10/1998 | Kakizawa et al. ........... 343/704 |
| 5,945,957 A * | 8/1999 | Kakizawa .................... 343/713 |
| 5,999,134 A | 12/1999 | Dishart et al. .............. 343/713 |
| 5,999,135 A * | 12/1999 | Nozaki et al. .............. 343/713 |
| 6,087,996 A | 7/2000 | Dery ........................... 343/713 |
| 6,229,493 B1 * | 5/2001 | Iijima .......................... 343/713 |
| 6,320,558 B1 * | 11/2001 | Walton ........................ 343/906 |

* cited by examiner

*Primary Examiner*—Hoanganh Le
(74) *Attorney, Agent, or Firm*—Standley & Gilcrest LLP

(57) ABSTRACT

The present invention includes antenna connectors, antenna connecting devices, and antenna connecting systems. This invention also includes machines or electronic devices using these aspects of the invention.

20 Claims, 3 Drawing Sheets

ON-GLASS IMPEDANCE MATCHING ANTENNA CONNECTOR

This is a continuation of application Ser. No. 09/349,067, filed Jul. 8, 1999 now U.S. Pat. No. 6,320,558.

TECHNICAL FIELD OF THE INVENTION

The present invention is in the field of antennae and antenna connectors.

BACKGROUND OF THE INVENTION

This invention relates to an antenna connecting apparatus useful in the automotive industry. More specifically, this invention relates to connecting an on-glass antenna to a transmission cable useful in automotive audio and communication devices.

One difficulty in utilizing on-glass antennae is obtaining a convenient method for connecting a printed on-glass metallic pattern to a transmission cable while providing wide band impedance matching. The impedance matching must be done in the FM frequency band, where the coaxial cable impedance is often 50 ohms, and the much lower AM frequency band, where the antenna and the receiver input impedance is closer to 6,000 ohms.

The present invention is based on a transformer design. The purpose of the transformer is to obtain the proper impedance matching at the FM frequency band from 88 to 108 MHz. A capacitor may also be used if the printed grounding pattern does not contain the proper capacitance. This capacitor behaves like a short circuit in the FM frequency band, and an open circuit in the AM frequency band. The combination results in a wide bandwidth and a transformation from the coaxial cable impedance to the antenna impedance. A convenient method of attachment is also provided for in the current invention.

Although described with respect to the fields of automotive audio and communication devices, it will be appreciated that similar advantages of a convenient wide band antenna connector may obtain in other applications of the present invention. Such advantages may become apparent to one of ordinary skill in the art in light of the present disclosure or through practice of the invention.

SUMMARY OF THE INVENTION

The present invention includes antenna connectors, antenna connecting devices, and antenna connecting systems. This invention also includes machines or electronic devices using these aspects of the invention. The present invention may also be used to upgrade, repair or retrofit existing machines or electronic devices or instruments of these types, using methods and components used in the art.

In broadest terms, the antenna connector for providing impedance matching to an electronic device, adapted to receive signals from the antenna, comprises: (1) an insulating substrate containing a mounting element attached to the surface of the substrate, (2) an antenna printed on the insulating substrate, (3) a transmission line adapted to carry a signal from the antenna to the electronic device, (4) a grounding contact adapted to provide an electrical ground for the antenna connector, and (5) a transformer adapted to obtain impedance matching between the transmission line and the antenna, where the poles of one coil of the transformer are connected to the transmission line and to the grounding contact, and the poles of the other coil are connected to the antenna and the grounding contact.

The antenna connector may also contain a capacitor device in connection with the transformer and grounding contact. The capacitor device can be in the form of a conductive pattern, e.g., a conductive mesh pattern, printed on the insulating substrate, in connection with the transformer, that provides a capacitive ground contact. A layer of insulating material can additionally be placed between the conductive pattern and ground. The transmission line will commonly be a coaxial cable, although other methods of transmission may be used. The transmission line is attached to the coil device by a push-on connector, such as a spade lug.

The transformer can alternatively be replaced by a tapped-coil transformer. The tapped-coil transformer should be adapted to obtain proper impedance matching between the transmission line and the antenna, where the poles of the coil are connected to the transmission line and the grounding contact. The antenna is then connected by a tap to the coil device. Changing the location of the tap can permit impedance adjustment.

The present invention also includes an on-glass antenna connector. In broadest terms, the on-glass antenna connector for providing impedance matching to an electronic device, adapted to receive signals from the antenna, comprises: (1) an automotive windshield containing a mounting pad attached to the windshield, (2) an antenna printed on the automotive windshield, (3) a transmission line capable of carrying a signal from the antenna to the electronic device, (4) a grounding contact adapted to provide an electrical ground for the antenna connector, (5) a transformer adapted to obtain impedance matching between the transmission line and the antenna, wherein the poles of one transformer coil are connected to the transmission line and to the grounding contact, and the poles of the other coil are connected to the antenna and the grounding contact, and (6) an insulating substrate, such as a clip, adapted to house the transformer and attach to the mounting pad.

The on-glass antenna connector may also contain a capacitor device in connection with the transformer and the grounding contact. The capacitor device can be in the form of a conductive pattern printed on the glass, in connection with the transformer, that provides a capacitive ground contact. A layer of insulating material can additionally be placed between the conductive pattern and ground. The transmission line will commonly be a coaxial cable, although other methods of transmission may be used. The transmission line is attached to the coil device by a push-on connector, such as a spade lug.

The transformer can alternatively be replaced by a tapped-coil transformer. The tapped-coil transformer should be adapted to obtain proper impedance matching between the transmission line and the on-glass antenna, where the poles of the coil are connected to the transmission line and the grounding contact. The antenna is then connected by a tap to the coil of the transformer. Changing the location of the tap can permit impedance adjustment. It is also recognized that the connector and antenna can be used on any insulating surface of a vehicle.

DETAILED DESCRIPTION OF THE PREFERRED EMBODIMENT(S)

In accordance with the foregoing summary, the following present a detailed description of the preferred embodiment of the invention that is currently considered to be the best mode.

Figure 1:
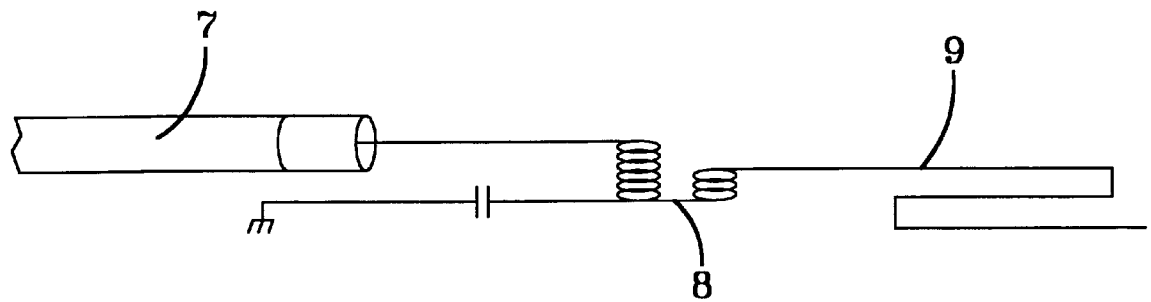
FIG. 1 is a diagram of the on-glass antenna connector.
Figure 2:
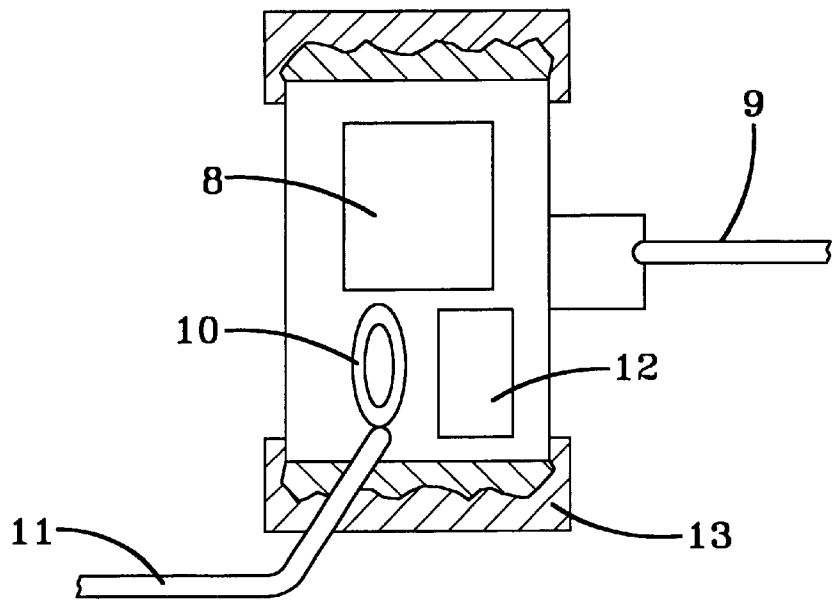
FIG. 2 shows the antenna connector with a capacitor and ground wire, where the connector is soldered to on-glass solder pads.

Referring to FIG. 1, a clip diagram is shown. The clip is shown connecting a coaxial cable 7 to a transformer 8 attached to the on-glass antenna pattern 9. FIG. 2 shows the same clip with a ground wire 11 attached to a capacitor 10 on the clip in connection with the transformer 8. The clip is soldered to an on-glass solder pad 13, and the coaxial cable attachment clip 12 is shown.

Figure 3:
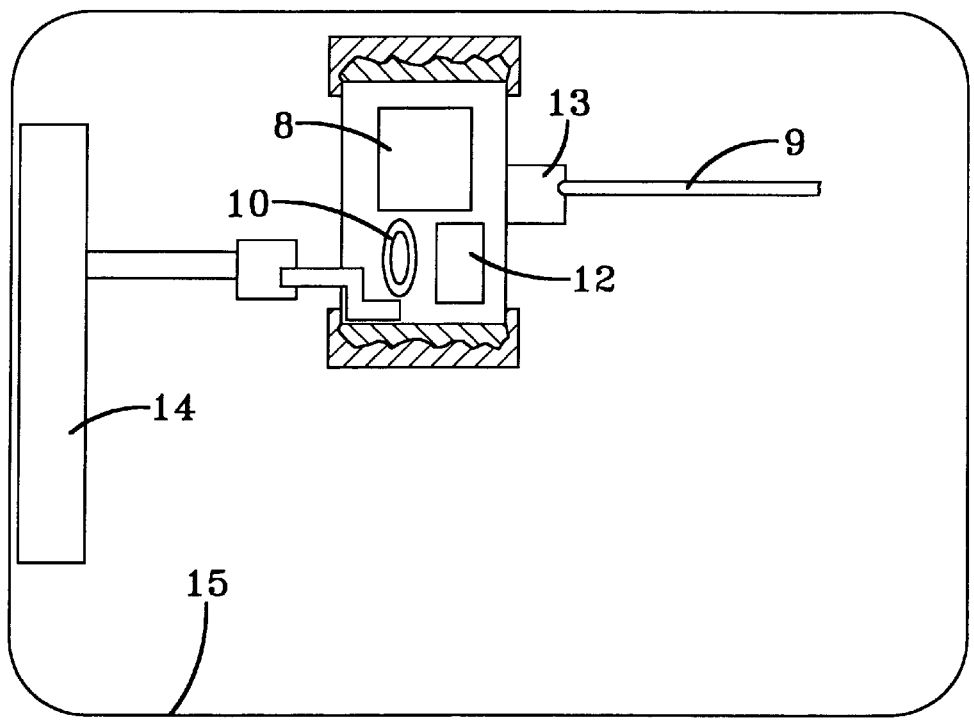
FIG. 3 is a diagram of the antenna connector with a printed ground patch.
Figure 4:
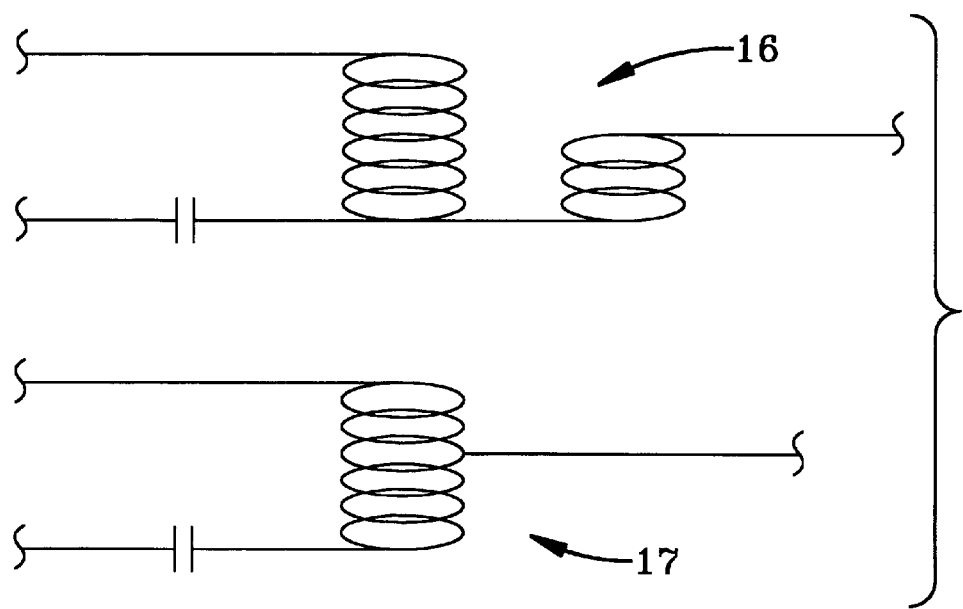
FIG. 4 shows a dual winding transformer design and a tapped coil transformer design.
Figure 5:
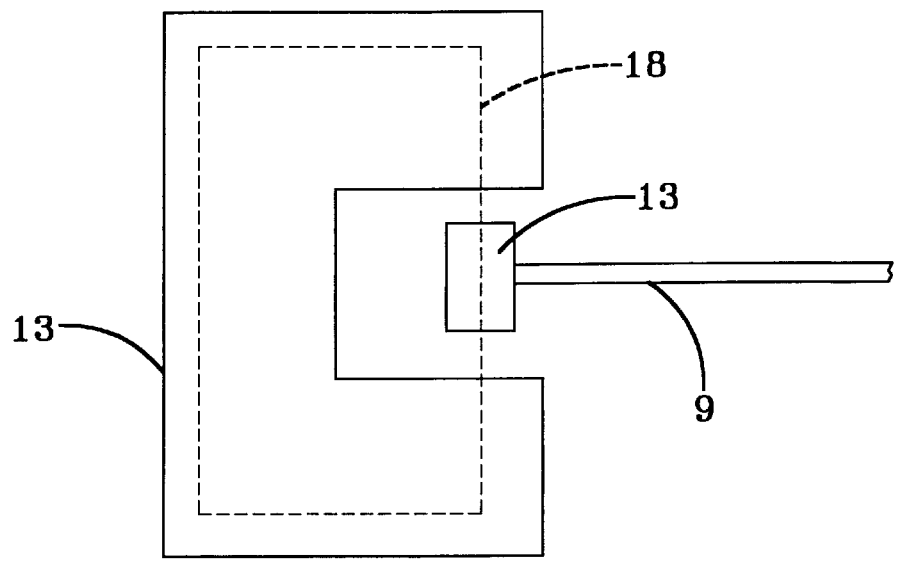
FIG. 5 shows the on-glass solder pattern to which the clip attaches.

FIG. 3 shows the antenna connector clip in connection with a printed on-glass grounding pattern 14 along the edge of the vehicle window 15. FIG. 4 shows two possible transformer 8 designs, a dual winding transformer 16 and a tapped coil transformer 17. FIG. 5 shows the solder pattern to which the connector clip attaches. The area where the clip will attach 18 is shown overlapping the solder pads 13.

Figure 6:
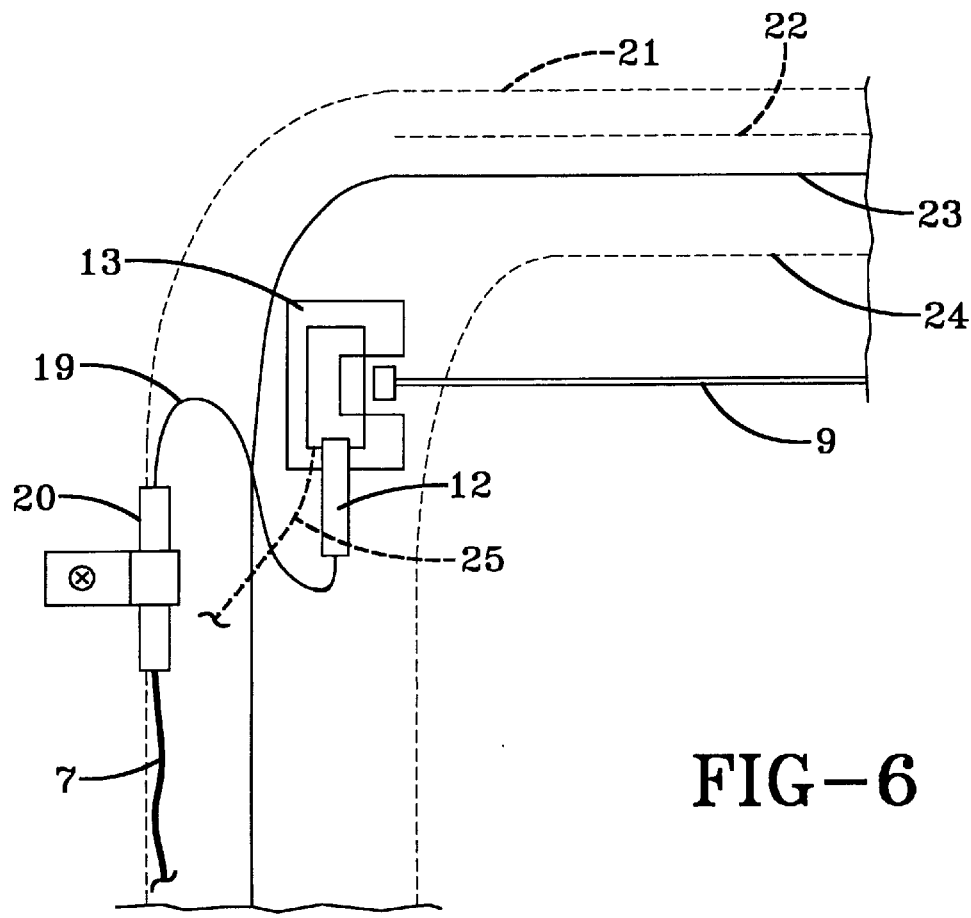
FIG. 6 is a diagram of the clip area inside an automobile.

FIG. 6 shows the inside of the clip area of an automobile. A metal tube 20 is shown between the bend in the metal 21 and the metal bezel edge 23, below the plastic molding edge 22. The tube 20 is used to connect the shielding of the coaxial cable 7 to the chassis of the vehicle by use of an attachment device. The center insulated wire 19 of the coaxial cable 7 is connected to the clip by the spade lug 12. The solder pad 13 is shown on the glass between the metal bezel edge 23 and the fade band edge 24. The solder pad 13 is connected to the on-glass antenna 9 and the plastic clip and spade lug 12, and optionally the potential replacement part ground wire 25.

The present invention is based on a transformer design, shown in the diagram of FIG. 1. The purpose of the transformer is to obtain the proper impedance matching at the FM frequency band. A capacitor may also be used if the printed grounding pattern does not contain the proper capacitance. This capacitor behaves like a short circuit in the FM frequency band, and like an open circuit in the AM frequency band. The combination results in a wide bandwidth and a transformation from the impedance of a coaxial cable to the antenna impedance.

The clip with the transformer device may need to be rigidly soldered to the glass substrate. Thus a connection means for the solder attachment to the glass is needed. This may be provided for by means of a mounting plate with solder tabs or a solder grid at the edges of the attachment plate. A pre-prepared solder pad may be utilized on the glass for this mechanically strong attachment. The attachment of the on-glass antenna pattern may be achieved by directly soldering a tab on the mounting plate to a prepared pad on the glass.

The center connector of the coaxial or other cable should be attached to the clip by a convenient means. This may be accomplished by a push-on connection, such as a spade lug or other connector. If a ground wire is used, it should attach from the capacitor to a convenient point on the chassis or other conducting part of the vehicle. A diagram of the present invention with a ground wire and capacitor is shown in FIG. 2.

It is also possible to implement a ground connection that capacitively connects to the chassis of a vehicle. In this embodiment, a printed conductive pattern may be printed on the glass near the edge of the glass part. Upon installation in the vehicle, this printed pattern would provide a capacitive connection to the chassis of the vehicle due to its proximity to the metallic parts of the vehicle, such as the window bezel. A diagram of this concept is shown in FIG. 3. A capacitor may not be required on the antenna connector if the printed grounding pattern has sufficient capacitance.

The transformer design shown in FIG. 1 is a dual winding design. Due to the grounded base characteristic of this design, it would also be possible to use another transforming device to achieve a similar level of impedance matching, such as an autotransformer. Autotransformers include tapped-coil transformers, magnetically-coupled transformers, and RF transformers. A diagram of this concept is shown in FIG. 4. The on-glass antenna may be of any type suitable for such applications, and may be capable reception or transmission. The antenna may take the form of a pattern of lines printed on the glass substrate. The connector may be used to connect to a transmission device attached to the glass substrate, or to a transmission line which in turn connects to an antenna or transmission device.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

What is claimed is:

1. An antenna connector for providing impedance matching to an electronic device adapted to receive signals from an antenna, said antenna connector comprising:

(a) an antenna;

(b) a transmission line adapted to carry a signal from said antenna to the electronic device;

(c) a grounding contact adapted to provide an electrical ground for said antenna connector;

(d) a transformer adapted to obtain impedance matching between said transmission line and said antenna wherein poles of one coil are connected to said transmission line and to said grounding contact and poles of another coil are connected to said antenna and said grounding contact; and (e) a capacitor connected to said grounding contact and said transformer, said capacitor adapted to provide coupling at FM frequencies while opening said grounding contact at AM frequencies to substantially prevent said transformer from acting to transform impedance in the AM frequencies.

2. The antenna connector according to claim 1 wherein said grounding contact is in the form of a conductive pattern printed on an insulating substrate in connection with said transformer, so as to provide a capacitive ground contact.

3. The antenna connector according to claim 2 additionally comprising an insulating material between said conductive pattern and ground.

4. The antenna connector according to claim 1 wherein said transmission line is selected from the group consisting of coaxial cable.

5. The antenna connector according to claim 1 wherein said transmission line is attached to the transformer using a push-on connection selected from the group consisting of spade lugs.

6. An antenna connector for providing impedance matching to an electronic device adapted to receive signals from an antenna, said antenna connector comprising:

(a) an antenna;

(b) a transmission line adapted to carry a signal from said antenna to the electronic device;

(c) a grounding contact adapted to provide an electrical ground for said antenna connector;

(d) a tapped coil transformer adapted to obtain impedance matching between said transmission line and said antenna wherein poles of said coil transformer are connected to said transmission line and to said grounding contact, and said antenna is connected to a wind of said coil transformer; and (e) a capacitor connected to said grounding contact and said coil transformer, said capacitor adapted to provide coupling at FM frequencies while opening said grounding contact at AM frequencies to substantially prevent said coil transformer from acting to transform impedance in the AM frequencies.

7. The antenna connector according to claim 6 wherein said grounding contact is in the form of a conductive pattern printed on an insulating substrate in connection with said tapped coil transformer, so as to provide a capacitive ground contact.

8. The antenna connector according to claim 7 additionally comprising an insulating material between said conductive pattern and ground.

9. The antenna connector according to claim 6 wherein said transmission line is selected from the group consisting of coaxial cable.

10. The antenna connector according to claim 6 wherein said transmission line is attached to the tapped coil transformer using a push-on connection selected from the group consisting of spade lugs.

11. An on-glass antenna connector for providing impedance matching to an electronic device adapted to receive signals from an antenna, said antenna connector comprising:

(a) an antenna printed on an automotive windshield;

(b) a transmission line adapted to carry a signal from said antenna to the electronic device;

(c) a grounding contact adapted to provide an electrical ground for said antenna connector;

(d) a transformer adapted to obtain impedance matching between said transmission line and said antenna wherein poles of one transformer coil are connected to said transmission line and to said grounding contact, and poles of another coil are connected to said antenna and said grounding contact; and (e) a capacitor connected to said grounding contact and said transformer, said capacitor adapted to provide coupling at FM frequencies while opening said grounding contact at AM frequencies to substantially prevent said transformer from acting to transform impedance in the AM frequencies.

12. The antenna connector according to claim 11 wherein said grounding contact is in the form of a conductive pattern printed on an insulating substrate in connection with said transformer, so as to provide a capacitive ground contact.

13. The antenna connector according to claim 12 additionally comprising an insulating material between said conductive pattern and ground.

14. The antenna connector according to claim 11 wherein said transmission line is selected from the group consisting of coaxial cable.

15. The antenna connector according to claim 11 wherein said transmission line is attached to the transformer using a push-on connection selected from the group consisting of spade lugs.

16. An on-glass antenna connector for providing impedance matching to an electronic device adapted to receive signals from an antenna, said antenna connector comprising:

(a) an antenna printed on an automotive windshield;

(b) a transmission line adapted to carry a signal from said antenna to the electronic device;

(c) a grounding contact adapted to provide an electrical ground for said antenna connector;

(d) a tapped coil transformer adapted to obtain impedance matching between said transmission line and said antenna wherein poles of said coil transformer are connected to said transmission line and to said grounding contact, and said antenna is connected to said coil transformer; and (e) a capacitor connected to said grounding contact and said coil transformer, said capacitor adapted to provide coupling at FM frequencies while opening said grounding contact at AM frequencies to substantially prevent said coil transformer from acting to transform impedance in the AM frequencies.

17. The antenna connector according to claim 16 wherein said grounding contact is in the form of a conductive pattern printed on an insulating substrate in connection with said tapped coil transformer, so as to provide a capacitive ground contact.

18. The antenna connector according to claim 17 additionally comprising an insulating material between said conductive pattern and ground.

19. The antenna connector according to claim 16 wherein said transmission line is selected from the group consisting of coaxial cable.

20. The antenna connector according to claim 16 wherein said transmission line is attached to the tapped coil transformer using a push-on connection selected from the group consisting of spade lugs.

* * * * *